SIMPLIFIED COMPRESSOR AMPLIFIER CIRCUIT UTILIZING
A FIELD EFFECT TRANSISTOR FEEDBACK LOOP
AND AUXILIARY SOLID STATE COMPONENTS
Filed May 13, 1964

INVENTORS
Philip L. Epstein &
Kuei-seng Wang
Morse & Altman
ATTORNEYS

United States Patent Office 3,334,308

Patented Aug. 1, 1967

3,334,308

SIMPLIFIED COMPRESSOR AMPLIFIER CIRCUIT UTILIZING A FIELD EFFECT TRANSISTOR FEEDBACK LOOP AND AUXILIARY SOLID STATE COMPONENTS

Philip L. Epstein, West Caldwell, and Kuei-Seng Wang, Hoboken, N.J., assignors to Quindar Electronics, Incorporated, Bloomfield, N.J., a corporation of New Jersey Filed May 13, 1964, Ser. No. 366,987
2 Claims. (Cl. 330—24)

Figures 1, 2:
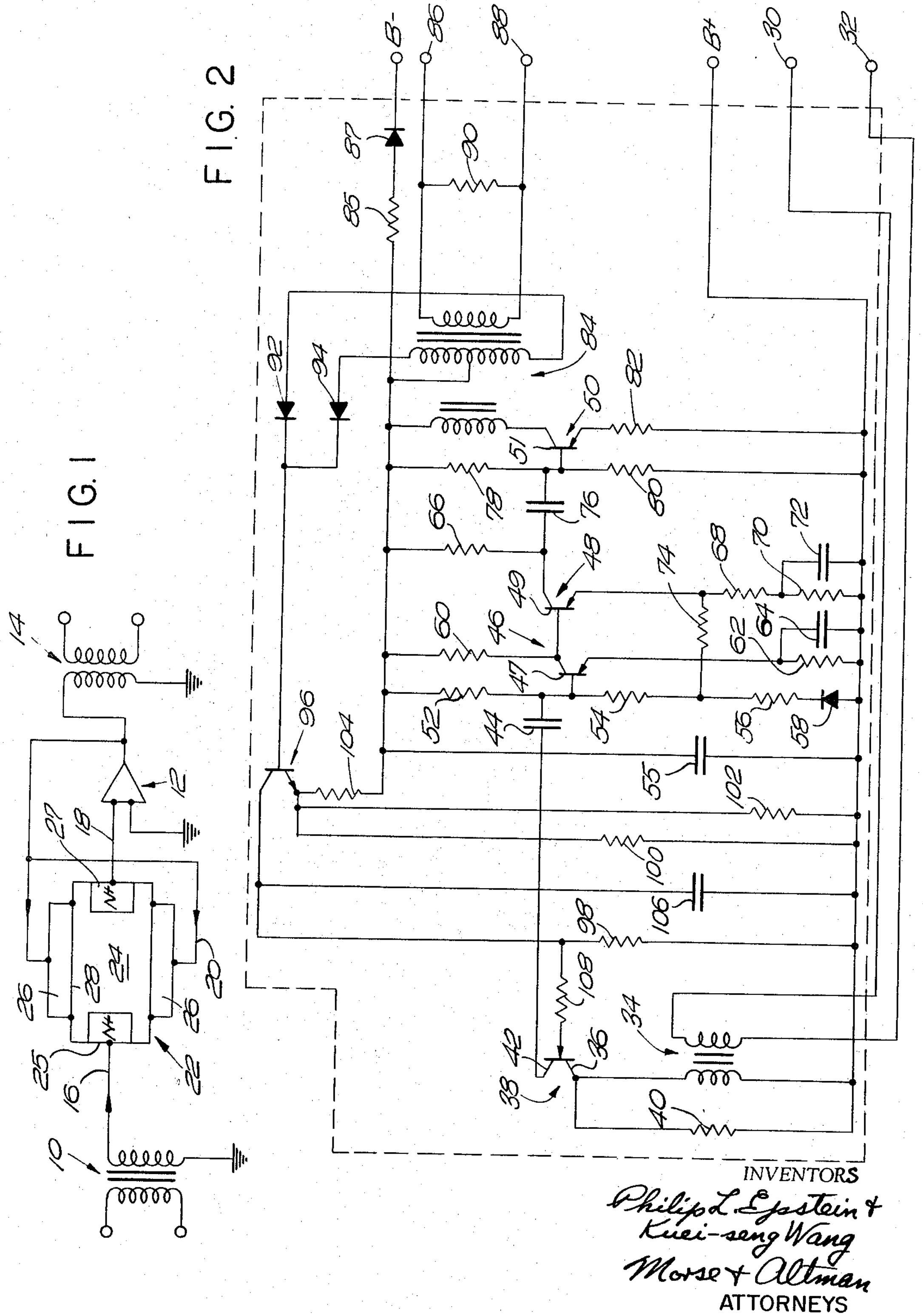

The present invention relates to the amplification of electronic signals and, more particularly, to an amplifier characterized by a constant level of audio signal output despite wide variations in the level of signal input. Such an amplifier is applicable for such purposes as compensation for different speech volumes of different operators using the same microphone, automatic gain control in radio reception, arbitrarily fixed output signal level of distantly cascaded amplifiers for telephonic transmission, etc.

The primary object of the present invention is the provision of a novel exclusively solid state amplifying circuit, in which the input signal is applied across the source and the drain of a so-called field effect transistor and a feedback signal from the following amplifying stages is applied to the gate of the field effect transistor. The stability of the solid state components and the simplicity of their interrelationships constitute the basis for a circuit design of unprecedented feasibility and efficiency.

Other objects of the present invention will in part be obvious and will in part appear hereinafter.

The invention accordingly comprises the circuit and components thereof involving the structure and interrelationships which are exemplified in the following disclosure, the scope of which will be indicated in the appended claims. For a fuller understanding of the nature and objects of the present invention, reference should be had to the following detailed description, taken in connection with the accompanying drawing, wherein:

FIG. 1 is a simplified diagram of a circuit embodying the present invention; and FIG. 2 is a detailed diagram schematically illustrating the circuit of FIG. 1.

Generally, as shown in FIG. 1, a modulated signal from a source 10 is applied to a sequence 12 of amplifier stages for transmission from an output 14. The input signal at 16, the output signal at 18 and a feedback signal at 20 are designated in relation to a field effect transistor 22. As shown, field effect transistor 22, in conventional fashion, includes a semi-conductor elongated bar 24 of N-type composition surrounded by a semi-conductor annular ring 26 of P-type composition doped with suitable impurities and forming a junction with bar 24. Composition 24 and composition 26 ordinarily are silicon or germanium with an alloy of their compositions at their interface 28. The application of a small voltage across elongated bar 24 between a so-called source 25 and a so-called drain 27 produces a relatively large current flow because of the low intrinsic resistance of material 24. Annular ring 26 generates space charge regions, or a field effect, within elongated bar 24 having a strong influence on the conductivity of the region between the source and the drain. At low levels of drain supply voltage, resistance depends upon the width of the current flow path allowed by the space charge regions, the so-called non-pinchoff region. The feedback signal applied to ring 26 thus serves to control the resistance of the device, and hence the output of the amplifier.

As shown in FIG. 2, an input alternating current is applied to input terminals 30, 32 for application across the primary of a transformer 34. The secondary of transformer 34 is connected between B+ and the source, as shown at 36, of the field effect transistor, as shown at 38. A load resistor 40 is shunted across the secondary of transformer 34 in order to provide a substantially constant input impedance. The drain, as shown at 42, of the field effect transistor is applied through a capacitor 44 to a cascaded amplifier sequence having a first stage 46, a second stage 48 and a third stage 50.

The signal applied through capacitor 44 is developed across resistors 52, 54 and 56 for application to the base of a transistor 47 of first stage 46. A diode 58 is provided for temperature compensation of the bias for first stage transistor 47. The potentials of the collector and the emitter of first stage transistor 47 are determined by resistors 60 and 62, resistor 62 being shunted by a bypass capacitor 64. The signal at the collector of first stage transistor 47 is applied to the base of a transistor 49 of second stage 48. The potentials of the collector and the emitter of second stage transistor 49 are determined by resistors 66, 68 and 70, resistor 70 being shunted by a bypass capacitor 72. A resistor 74 is connected between the emitter of second stage transistor 49 and a point at the junction of resistors 54 and 56 for stabilization of the gain. The output from the collector of second stage transistor 49 is coupled through a capacitor 76 to the base of transistor 51 of third stage 50, the signal being developed across a pair of resistors 78, 80. The output signal from third stage transistor 50 is developed across the primary of a transformer 84. A secondary of transformer 84 is provided to develop a signal across output terminals 86 and 88, which are shunted by resistor 90 to provide constant output impedance. The power supply voltage applied to the amplifier is filtered by resistor 85 and capacitor 55. A diode 87 prevents damage to the unit should reverse voltage be inadvertently applied.

Feedback is developed across a secondary of transformer 84 having three taps, the center tap of which is connected through arrangement 85, 87 to B— and the outer taps of which are connected through a pair of rectifying diodes 92, 94 to the base of an amplifying and isolating transistor 96. The amplifying threshold of transistor 96 is determined by resistors 100 and 104, which are biased by B— and B+. A filter capacitor 106 is connected across resistor 98 and the collector of transistor 96 is connected through a resistor 108 to the gate of field effect transistor 38.

Preferred values of the certain components of the schematic diagram of FIG. 2 are as follows:

| Component Designation | Drawing Numeral | Value |
|---|---|---|
| R1 | 40 | 1 ohm. |
| R2 | 108 | 100 k. ohm. |
| R3 | 98 | 100 k. ohm. |
| R4 | 100 | 3.3 k. ohm. |
| R5 | 104 | 360 ohm. |
| R6 | 52 | 10 k. ohm. |
| R7 | 54 | 1 k. ohm. |
| R8 | 56 | 100 ohm. |
| R9 | 62 | 1.8 k. ohm. |
| R10 | 74 | 7.5 k. ohm. |
| R11 | 60 | 10 k. ohm. |
| R12 | 66 | 3.9 k. ohm. |
| R13 | 68 | 100 k. ohm. |
| R14 | 70 | 4.7 k. ohm. |
| R15 | 78 | 6.8 k. ohm. |
| R17 | 82 | 300 ohm. |
| R18 | 80 | 1,000 ohm. |
| R19 | 85 | 150 ohm. |
| H21 | 90 | 620 ohm. |
| B+ | | +12 volts. |
| B— | | —12 volts. |
| C1 | 106 | 10 μf. |
| C2 | 44 | 40 μf. |
| C3 | 64 | 250 μf. |
| C4 | 72 | 250 μf. |
| C5 | 76 | 40 μf. |

In operation, an input alternating signal at terminals 32, 30 is applied across transformer 34 to source 36 of field effect transistor 38, the drain of which is applied to a three stage amplifier cascade 46, 48 and 50. The resulting output appears at terminals 86, 88. Feedback is effected through rectifying arrangement 92, 94 and a transistor amplifier stage 96, by which a feedback signal is applied to the ring or gate of field effect transistor 38. The arrangement is such that the threshold level of the field effect transistor may be adjusted conveniently. This circuit will maintain its audio output within plus or minus two decibels of the nominal level of −1 dbm during input power variations from −50 dbm to −18 dbm. The nature of the compression process is such that some distortion of the signal occurs, especially at maximum input levels. However, the total harmonic distortion will be less than 5%, even at maximum compression. The circuit has an input level tolerance of 2.5 to 100 millivolts, an input impedance of 400 to 600 ohms varying with input level change from −50 dbm to −18 dbm an output level of 700 millivolts into 600 ohms, an attack time of 15 milliseconds, a release time of 1.0 second, a response indicated by an output constant within plus or minus 0.1 db over frequency range of 150 to 10,000 c.p.s. within specified input level variation of −35 db, a gain of 50 db max., and a power requirement of 10 ma. at 12 v. DC regulated.

The present invention thus provides an extremely simple but efficacious compressor amplifier utilizing all solid state components. Since certain changes may be made in the above apparatus without departing from the scope of the invention herein involved, it is intended that all matter contained in the above description or shown in the accompanying drawings be interpreted in an illustrative and not in a limiting sense.

What is claimed is:

1. A compressor amplifier comprising an input transformer having input terminals for applying an input signal across the primary thereof, a field effect transistor having a source, a drain and a gate, said field effect transistor including a semi-conductor elongated bar of N-type composition and a semi-conductor ring of P-type composition surrounding said elongated bar, said semi-conductor ring forming a junction with said semi-conductor elongated bar one terminal on said semi-conductor elongated bar constituting a source and another terminal on said semi-conductor elongated bar constituting a drain, said N-type composition of said elongated bar having a low intrinsic resistance whereby the application of a relatively small voltage across said elongated bar between said source and said drain producing a relatively large current flow, said annular ring generating space charge regions having an effect on the conductivity of the region between said source and said drain, the secondary of said input transformer being connected between a terminal of constant potential and said source, a load resistor shunted across said secondary of said transformer in order to provide a substantially constant input impedance, a cascaded series of transistor amplifier stages, said drain being capacitively coupled to the input of said cascaded series, an output transformer, the output signal of said cascaded series of transistor amplifier stages being applied to the primary of said output transformer, diode means connected to the secondary of said output transformer, an isolating transistor amplifier stage having a base connected to the output of said diode means and having an output terminal connected to said gate of said field effect transistor whereby relatively major variations in input signal amplitude result in relatively minor variations in output signal magnitude.

2. The compressor amplifier of claim 1 wherein said output transformer has a first secondary means and a second secondary means, said first secondary means having center tap means and a pair of end tap means, said center tap means being at constant potential, said diode means having a pair of diodes with input terminals connected respectively to said end tap means and having output means connected in parallel, said isolating transistor amplifier stage having a base connected to said output means of said pair of diodes.

References Cited

UNITED STATES PATENTS

| | | | |
|---|---|---|---|
| 3,112,411 | 11/1963 | Cook et al. | 307—88.5 |
| 3,229,218 | 1/1966 | Sickles et al. | 330—29 |
| 3,243,719 | 3/1966 | Scaroni | 330—29 |

ROY LAKE, *Primary Examiner.*

NATHAN KAUFMAN, *Examiner.*

J. B. MULLINS, *Assistant Examiner.*